United States Patent [19]

Neuman et al.

[11] Patent Number: 5,599,387

[45] Date of Patent: Feb. 4, 1997

[54] COMPOUNDS AND COMPOSITIONS FOR COATING GLASS WITH SILICON OXIDE

[75] Inventors: George A. Neuman; Patricia R. Athey, both of Pittsburgh; Royann L. Stewart-Davis, Springdale, all of Pa.

[73] Assignee: PPG Industries, Inc., Pittsburgh, Pa.

[21] Appl. No.: 472,589

[22] Filed: Jun. 7, 1995

Related U.S. Application Data

[60] Continuation-in-part of Ser. No. 264,816, Jun. 23, 1994, Pat. No. 5,464,657, which is a division of Ser. No. 17,930, Feb. 16, 1993, Pat. No. 5,356,718.

[51] Int. Cl.⁶ ..................................................... C09D 5/00
[52] U.S. Cl. .................... 106/287.14; 427/255.2
[58] Field of Search ...................... 106/282.14; 427/288.2

[56] References Cited

U.S. PATENT DOCUMENTS

| | | |
|---|---|---|
| 3,378,396 | 4/1968 | Zaromb . |
| 3,674,453 | 7/1972 | Loukes et al. . |
| 3,681,042 | 8/1972 | Edwards et al. . |
| 4,146,657 | 3/1979 | Gordon . |
| 4,187,336 | 2/1980 | Gordon . |
| 4,206,252 | 6/1980 | Gordon . |
| 4,265,974 | 5/1981 | Gordon . |
| 4,308,316 | 12/1981 | Gordon . |
| 4,377,613 | 3/1983 | Gordon . |
| 4,386,117 | 5/1983 | Gordon . |
| 4,419,386 | 12/1983 | Gordon . |
| 4,440,822 | 4/1984 | Gordon . |
| 4,468,420 | 8/1984 | Kawahara et al. . |
| 4,469,045 | 9/1984 | Chesworth . |
| 4,590,096 | 5/1986 | Lindner . |
| 4,853,257 | 8/1989 | Henery . |
| 4,894,352 | 1/1990 | Lane et al. . |
| 5,168,003 | 12/1992 | Proscia . |
| 5,221,352 | 6/1993 | Terneu et al. . |
| 5,248,545 | 9/1993 | Proscia . |
| 5,271,960 | 12/1993 | Proscia . |
| 5,401,305 | 3/1995 | Russo et al. . |

FOREIGN PATENT DOCUMENTS

| | | |
|---|---|---|
| 33230/93 | 7/1993 | Australia . |
| 85305470.8 | 3/1986 | European Pat. Off. . |
| 2031756 | 4/1980 | United Kingdom . |

OTHER PUBLICATIONS

Strong, J.; "Practical Applications of High and Low-Reflecting Films on Glass", *Le Journal De Physique Et Le Radium*, (Jul. 11, 1950;) pp. 441–443.

Delperier, B. et al.; "Analysis and Modelling of Tetraethoxysilane Pyrolysis"; *Journal of Analytical and Applied Pyrolysis*, 13 (1988) pp. 141–149.

(List continued on next page.)

Primary Examiner—David Brunsman
Attorney, Agent, or Firm—Donald C. Lepiane

[57] ABSTRACT

Silicon compounds useful as coating reactants for the chemical vapor deposition of silicon oxide are disclosed, along with compounds useful as accelerants to increase the deposition rate of silicon oxide. The silicon-containing precursor comprises the structural formula

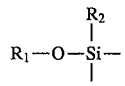

wherein $R^1$ is an alkyl, alkenyl, alkynyl or aryl radical which may be substituted, and $R_2$ is a functional group which increases the reactivity of the silicon compound by withdrawing electron density away from the silicon atom, such as hydrogen, halogen, alkenyl, alkynyl, halogenated alkyl and perhalogenated alkyl radicals. The accelerant is a compound selected to take advantage of the partial positive charge on the silicon atom. Such accelerant compounds include Lewis acids and bases; water; ozone; trivalent compounds of nitrogen, boron and phosphorus; tetravalent compounds of sulfur and selenium; pentavalent compounds of phosphorus and a variety of metal compounds. Also disclosed are compositions including an additional metal-containing coating precursor, such as an organotin compound, to deposit another metal oxide along with silicon oxide.

37 Claims, 4 Drawing Sheets

OTHER PUBLICATIONS

Inoue, K. et al.; "Low Temperature Growth of $SiO_2$ Thin Film by Double–Excitation Photo–CVD"; *Japanese Journal of Applied Physics;* vol. 26, No. 6, (Jun., 1987,) pp. 805–811.

Toyoda, Y. et al.; "Preparation of $SiO_2$ Film by Photo–Induced Chemical Vapor Deposition Using a Deuterium Lamp and Its Annealing Effect"; *Japanese Journal of Applied Physics;* vol. 26, No. 6, (Jun. 1987,) pp. 835–840.

Chang, C. P. et al.; "Ion and Chemical Radical Effects on the Step Coverage of Plasma Enhanced Chemical Vapor Deposition Tetraethylorthosilicate Films"; *J. Appl. Phys.;* 67(4), 15 (Feb. 1990).

Niwano, M. et al.; "Low–Temperature Deposition of Silicon Dioxide Films by Photoinduced Decomposition of Tetraethoxysilane"; *Japanese Journal of Applied Physics;* vol. 28, No. 7, (Jul., 1989,) pp. L1310–L1313.

Taylor, R. C. et al.; "Hexachlorodisilane as a Precursor in the LPCVD of Silicon Dioxide and Silicon Oxynitride Films"; *J. Electrochem. Soc.;* vol. 136, No. 8, (Aug. 1989), pp. 2382–2386.

Okuhara, T. et al.; "Preparation of $SiO_2$ overlayers on Oxide Substrates by Chemical Vapor Deposition of $Si(OC_2H_5)_4$"; *Applied Surface Science* 29 (1987), pp. 223–241.

Chapple–Sokol, J. D. et al.; "A Kinetics Study of the Atmospheric Pressure CVD Reaction of Silane and Nitrous Oxide"; *J. Electrochem. Soc.,* vol. 136, No. 10, (Oct. 1989), pp. 2993–3003.

Hochberg, A. K. et al.; "The Use of Liquid Sources in CVD Applications: Fire Safety Considerations and Delivery Methods"; Technical Article 15 of J. C. Schumacker, a Unit of Air Products and Chemicals, Inc. no date avail.

Crowell, J. E. et al.; "Model Studies of Dielectric Thin Film Growth: Chemical Vapor Deposition of $SiO_2$"; pp. 1864–1870 no date avail.

Pavelescu, C. et al.; "Correlations Between the Properties and the Deposition Kinetics of Low–Temperature Chemical Vapour Deposited $SiO_2$ Films: The Effect of $O_2/SiH_4$ Mole Ratio"; *Journal of Materials Science Letters* 9 (1990) no month avail. pp. 143–144.

Lucovsky, G. et al.; "Deposition of Silicon Oxide, Nitride and Oxynitride Thin Films by Remote Plasma Enhanced Chemical Vapor Deposition"; *Journal of Non–Crystalline Solids;* 90 (1987) no month avail. pp. 259–266.

Orfescu, C. et al.; "An Etch Rate Study on Thermally Annealed $SiO_2$ Films Deposited in a TESO–LPCVD System"; *Journal of Materials Science* 25 (1990) no month avail. pp. 1366–1368.

Maruyama, Toshiro et al.; "Silicon Dioxide Thin Films Prepared by Chemical Vapor Deposition from Silicon Tetraacetate"; *Japanese Journal of Applied Physics;* vol. 28, No. 12, (Dec. 1989), pp. L2253–L2254.

Ozturk, Mehmet C. et al.; "Low–Pressure Chemical Vapor Deposition of Polycrystalline Silicon and Silicon Dioxide by Rapid Thermal Processing", *Mat. Res. Soc. Symp. Proc.,* vol. 146, (1989) no month avail. pp. 109–114.

Webb, Douglas A. et al.; "Silicon Dioxide Films Produced by PECVD of TEOS and TMCTS"; *Proc. 2nd International ULSI Science and Technology Symposium* ECS Proc. vol. 89(9)(1989) no month avail. pp. 571–578.

Hochberg, A. K. et al.; "The LPCVD of Silicon Oxide Films below 400°C from Liquid Sources", *J. Electrochem. Soc.,* vol. 136, No. 6, (Jun. 1989), pp. 1843–1844.

Hochberg, Dr. A. et al.; "User's Guide For: Glass Deposition with LTO–410™ Source Material" no date avail.

Desu, S. B.; "Decomposition Chemistry of Tetraethoxysilane"; Abstrate No. 1855RNP; presented at the Fall Meeting of Electrochemical Society, Honolulu, Hawaii, 18–23 (Oct., 1987).

Raju, Surya K. et al.; "Analytical Model for the Low Pressure Chemical Vapor Deposition of $SiO_2$ from Tetraethoxysilane" no date avail.

J. C. Schumacher Co.,; Tetramethylcyclotetrasiloxane "Tomcats™"; Chemical & Physical Properties no date avail.

Hochberg, A. K. et al.; "The Deposition of Silicon Oxide Films at Low Temperatures from Liquid Sources" no date avail.

Roy A. Gordon: Patent and Patent Citations (Derwent World Patent Records) no date avail.

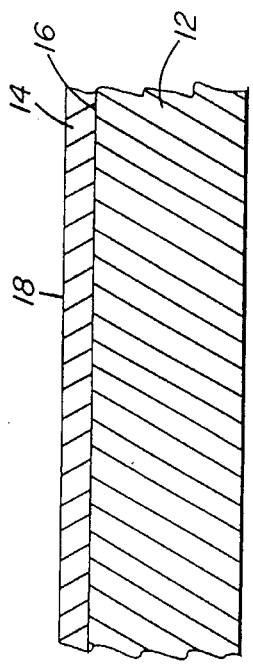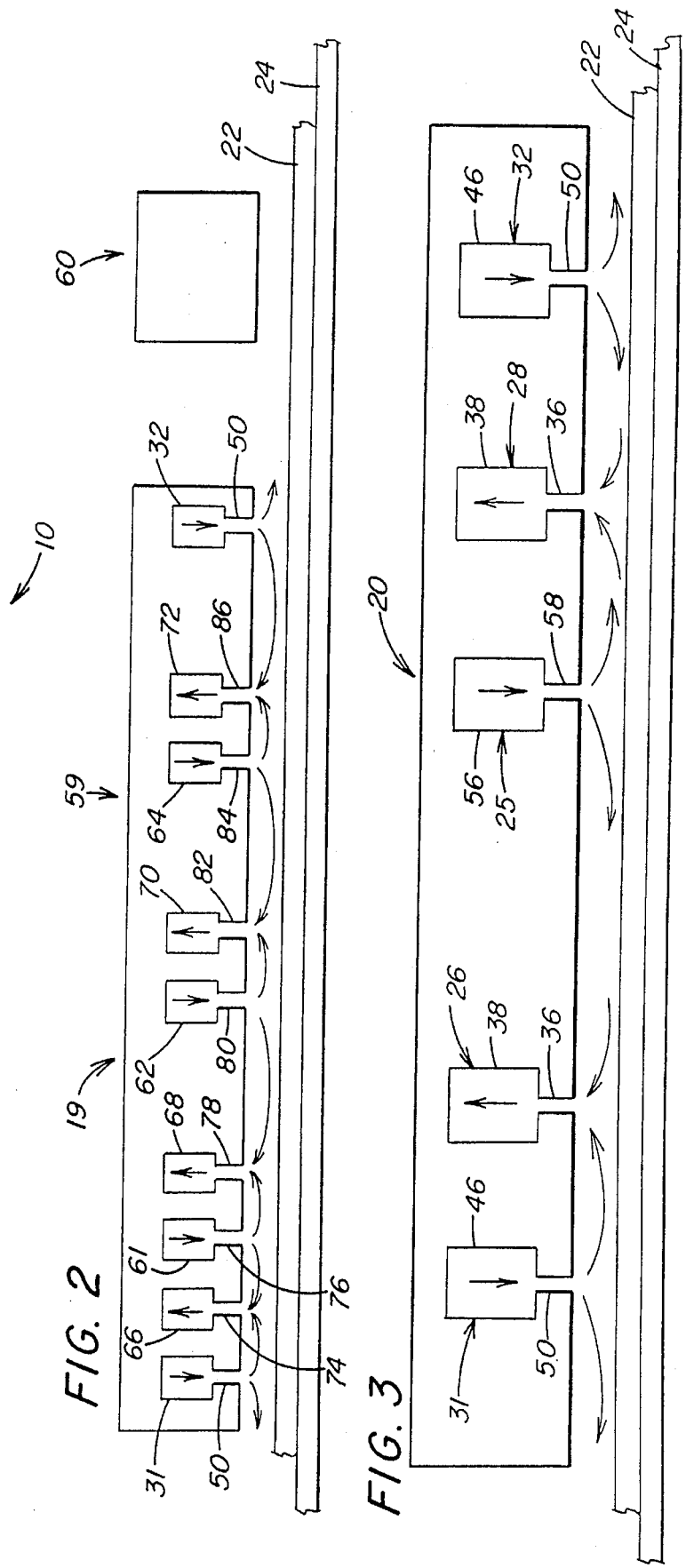

COMPOUNDS AND COMPOSITIONS FOR COATING GLASS WITH SILICON OXIDE

CROSS-REFERENCE TO RELATED APPLICATION

This application is a continuation-in-part of U.S. application Ser. No. 08/264,816 filed Jun. 23, 1994, now U.S. Pat. No. 5,464,657, which is a division of U.S. application Ser. No. 08/017,930 filed Feb. 16, 1993, now U.S. Pat. No. 5,356,718.

BACKGROUND OF THE INVENTION

1. Field of the Invention

This invention relates to compounds and compositions for the chemical vapor deposition of one or more metal oxides including silicon oxide on a substrate e.g. glass, to silicon containing precursors used in the preparation of coating compositions containing silicon oxide and other metal oxides, and to the accelerants for enhancing the deposition rate of such oxides.

2. Description of the Relevant Art

It is known in the art that when a film of a transparent metal oxide, such as tin oxide, is deposited on a glass substrate, the coated glass substrate has non-uniform light-reflection across the visible spectrum because of the difference in the refractive index between the metal oxide and the glass substrate. In addition, when the thickness of the metal oxide coating is not uniform, the coating tends to display a multiplicity of interference color effects commonly referred to as iridescence. Such iridescence effects render the coated glass aesthetically unacceptable for most architectural applications. Thus, various methods to mask such iridescence effects and/or reduce reflectance have been proposed.

One technique for minimizing or eliminating the difference of the refractive index between a metal oxide and a glass substrate is disclosed in U.S. Pat. No. 3,378,396 to Zaromb wherein a glass substrate is coated by simultaneously directing separate sprays of a tin chloride solution and of a silicon chloride solution onto a stationary heated glass piece in an oxidizing atmosphere e.g. air. The heat of the glass piece thermally converts the metal chlorides to their metal oxides. The ratio of the sprays to each other are gradually varied to vary the ratio of the weight percent of the metal oxides in the coating. The resultant coating has a continuously-changing composition throughout its thickness, e.g. near the glass-coating interface, the coating is predominantly silicon oxide, the surface of the coating furthest from the glass-coating interface is predominantly tin oxide and there-between the coating is made up of varying weight percent amounts of silicon oxide and tin oxide. Strong in his publication entitled "Practical Applications of High and Low-Reflecting Films on Glass", pages 441–443 of *Le Journal de Physique et Le Radium*, Vol. 11, July 1950, teaches that a coating technique similar to that taught by Zaromb reduces the iridescence of the coated article.

Additional techniques using the Zaromb teachings to coat a moving substrate are taught in U.S. Pat. Nos. 4,206,252 and 4,440,882. These patents further teach the depositing of a second coating composed of fluorine-doped tin oxide on the first coating of the type taught by Zaromb.

Gordon, in U.S. Pat. Nos. 4,187,336 and 4,308,316 discloses the reduction of iridescence of a tin oxide coating on a glass substrate by the use of an intermediate coating between the tin oxide coating and the glass substrate having a thickness and refractive index satisfying the optical equation: the refractive index of the intermediate coating is equal to the square root of the refractive index of the glass substrate times the refractive index of the tin oxide coating.

U.S. Pat. Nos. 4,377,613 and 4,419,386 to Gordon disclose a reduction in iridescence arising from a tin oxide film on a glass substrate by providing two intermediate coating layers between the glass substrate and the tin oxide. The intermediate layer next to the surface of the glass substrate has a high refractive index, while the intermediate layer farther from the surface of the glass substrate and next to the tin oxide film has a lower refractive index.

In general, the patents discussed above, except for U.S. Pat. Nos. 4,206,252 and 4,440,822, teach coating a stationary glass substrate. Apparatuses for coating a moving glass substrate with metal oxides are disclosed in the above discussed U.S. Pat. Nos. 4,206,252 and 4,440,882 to Gordon, and in U.S. Pat. No. 4,853,257 to Henery and U.S. Pat. No. 4,386,117 to Gordon.

In U.S. Pat. Nos. 4,206,252 and 4,440,882, the underside of a moving hot glass ribbon is coated by directing coating compositions containing metal compounds toward the ribbon surface, whose compounds are converted to their corresponding metal oxides.

U.S. Pat. No. 4,853,257 discloses an apparatus for depositing a low emissivity film on a glass ribbon by directing metal-containing coating reactants in vapor form onto the upper surface of a glass ribbon while the glass ribbon is supported on a molten metal bath contained in a non-oxidizing atmosphere. The carrier gas, the unreacted coating composition and any decomposition by-products are removed from the coating zone by an exhaust orifice on each side of, and equidistant from, the position where the coating reactants in vapor form are directed toward the glass ribbon.

U.S. Pat. No. 4,386,117 discloses a process for depositing a mixed metal oxide coating on a glass substrate by directing a gaseous mixture onto a moving glass ribbon and then exhausting gases from the coating zone at two locations equidistant from the entry of the gaseous mixture into the coating zone.

Although each of the apparatuses and processes taught in the above-discussed patents is acceptable for its intended purpose, there are limitations when the apparatuses and processes are used to apply the coating of Zaromb to a moving heated glass substrate, e.g. a glass ribbon supported on a molten metal bath contained in a non-oxidizing atmosphere. It would be advantageous, therefore, to provide apparatuses and processes to deposit the coating of Zaromb on a moving heated substrate as well as the metal containing precursors used in the preparation of the coating.

One of the limitations of the presently available vapor coating system for coating a glass ribbon moving at fast speeds e.g. about 600 inches/min. (15.24 meters/min.) is that the vapor coating mixture does not have sufficient time to deposit a coating of acceptable thickness on the glass ribbon. The article entitled "The LPCVD of Silicon Oxide Films Below 700° F. (400° C.) From Liquid Sources" by A. K. Hochberg and D. L. O'Meara published in *J. Electrochem. Soc.* Vol. 136, No. 6, June 1989 copyrighted by The Electrochemical Society, Inc. pps. 1843 and 1844 teaches the use of trimethylphosphite to accelerate coating deposition below 750° F. (400° C.). The publication "User's Guide For: Glass Deposition with LTO-410™ Source Material" by Dr. A. Hochberg and Dr. B. Gelernt, copyrighted 1990 by Schumacher of Carlsbad, Calif., 92009 teaches that the LTO-410 process is not significantly changed with the addition of trimethylphosphite.

Although the use of accelerants is taught, there are no teachings that such accelerants are beneficial at elevated temperatures e.g. above 750° F. (400° C.). Therefore it would be advantageous to provide accelerants for coating systems that operate at temperatures above about 1000° F. (536° C.).

SUMMARY OF THE INVENTION

The invention relates to compounds and compositions for coating a moving substrate, e.g. a glass ribbon supported and advancing on a pool of molten metal, e.g. tin, with a film or coating comprising silicon oxide by directing a vapor coating composition of metal containing precursors, e.g. a silicon-containing precursor and a tin-containing precursor, onto the surface of the glass ribbon. The silicon-containing precursor comprises at least one compound comprising the structure

wherein $R_1$ is alkyl, alkenyl, alkynyl or aryl radical, and $R_2$ is hydrogen, halogen, alkenyl, halogenated alkyl, perhalogenated alkyl or alkynyl radical. The silicon-containing precursor may be selected from compounds having one of the structural formulae:

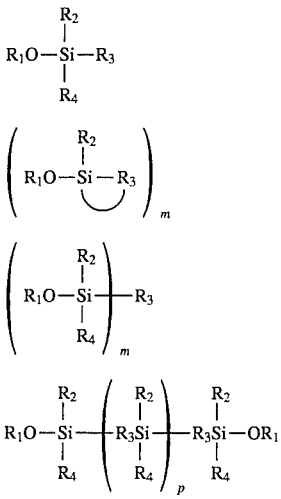

wherein m is from 2 to 7, p is from 0 to 7, and $R_3$ is independently selected from the group consisting of

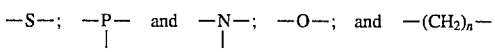

wherein n is 1 to 10; and $R_4$ is alkyl, alkenyl, alkynyl, aryl, hydrogen, halogen, —CN, —OCH, and phosphines. The coating composition may further comprise metal-containing precursors of metals other than silicon, e.g. tin compounds, such as organotin compounds. The coating compositions may also comprise an accelerant capable of enhancing the reaction rate of the silicon compound. The accelerants include Lewis acids and Lewis bases, water, ozone and metal compounds.

BRIEF DESCRIPTION OF THE DRAWINGS

FIG. 1 illustrates a coated substrate incorporating features of the invention and obtained using the apparatuses, processes, and coating materials of the invention.

FIG. 2 is an elevation view of a coating system having two coating stations, one of which includes a coating apparatus having multiple coating zones incorporating features of the invention.

FIG. 3 is a view similar to that of FIG. 2 of a coating apparatus having one coating zone incorporating features of the invention.

DESCRIPTION OF PREFERRED EMBODIMENTS

Figure 4:
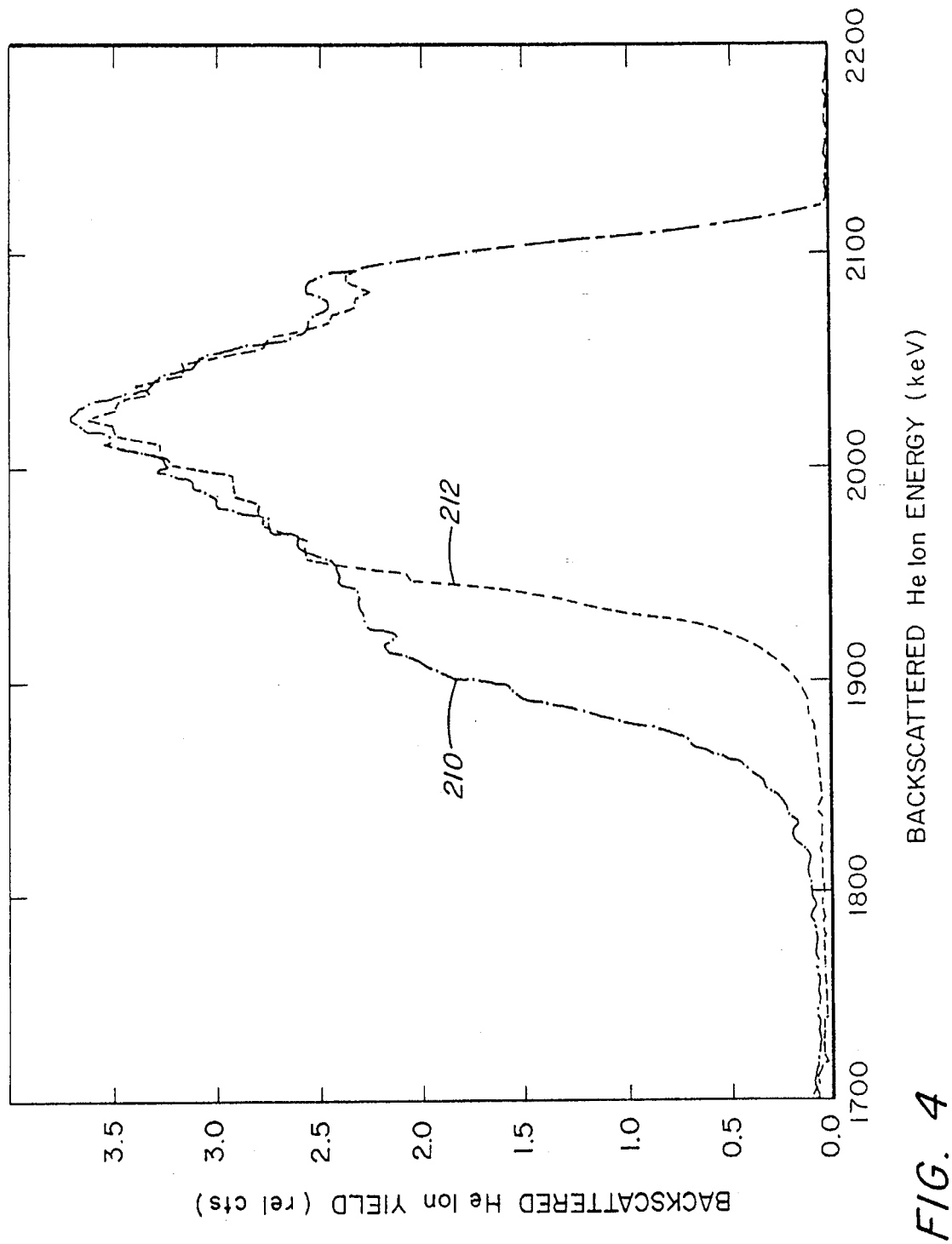
FIG. 4 is a graph showing a gradient coating and an extended and improved gradient coating deposited in accordance with the teachings of the invention.

Referring to FIG. 1, there is shown a coated article 10 incorporating features of the invention that can be made using the apparatuses, processes, and coating materials, of the invention. In general, the article 10 includes a substrate 12, e.g. but not limiting to the invention, plastic and/or clear or colored glass, having a coating 14 that exhibits minimum reflected color by having a continually varying refractive index, and preferably has an emissivity lower than the uncoated substrate. In the following discussion the substrate is a glass substrate. The coating 14, in general, is composed of a mixture of silicon oxide and a metal oxide, such as tin oxide. As with Zaromb, discussed above, the coating 14 has a continuously changing composition as the distance from the glass-coating interface 16 increases. Generally, near the glass-coating interface 16, the coating is predominantly silicon oxide, while at the opposite surface 18 of the coating 14 e.g. the coating surface farthest from the glass-coating interface 16, the composition of the coating is predominantly tin oxide. The predominantly tin oxide region may continue as predominantly tin oxide for a thickness required by the use of the article. For example when an article having a high emissivity is desired e.g. close to the emissivity of the glass substrate, the predominantly tin oxide region is thin; when an article having a low emissivity is desired, the predominantly tin oxide region is thicker. The tin oxide region may be doped with fluorine or antimony as taught in U.S. Pat. No. 3,677,814 to further reduce emissivity. Between the glass-coating interface 16 and opposite surface 18, the coating 14 is composed of continuously varying amounts of silicon oxide and tin oxide as the distance from the glass-coating interface 16 increases. In other words, as the distance from the glass-coating interface 16 increases, each succeeding region of the continuously varying composition in the coating 14 contains a tin oxide to silicon oxide weight percent ratio different than the preceding region and although not limiting to the invention, usually that ratio tends to increase as the distance from glass-coating interface 16 increases. The opposite surface 18 is predominantly tin oxide, i.e., the weight percent of silicon oxide in the outermost region approaches zero, and the weight percent of tin oxide approaches 100.

Although the coating 14 was discussed using a coating of tin oxide and silicon oxide, the invention is not limited thereto and as will be appreciated from the discussion below any two or more metal oxides may be used in the practice of the invention.

The coated article 10 of FIG. 1 was produced using coating system 19 shown in FIG. 2. A discussion of coating apparatus 20 in FIG. 3 will now be presented for a better appreciation of the features of the coating system 19 shown in FIG. 2. The apparatus 20 of FIG. 3 may be used to deposit a non-homogeneous coating of the type discussed above on the glass substrate 12. In FIG. 3 as in FIG. 2, the substrate 12 is a glass ribbon 22 or pieces cut therefrom.

With reference to FIG. 3, coating apparatus 20 is supported in any convenient manner above and spaced from the glass ribbon 22 supported on a pool or bath 24 of molten metal contained in a chamber having a non-oxidizing atmosphere, not shown, e.g. of the type of chamber taught in U.S. Pat. No. 4,853,257 whose teachings are hereby incorporated by reference. As viewed in FIG. 3, the glass ribbon 22 moves from left to right beneath the coating apparatus 20 e.g. through a coating position. As will be appreciated the invention is not limited to the chamber, not shown, containing the pool of molten metal, nor to a non-oxidizing atmosphere and any chamber design having any type of atmosphere as well as other processes for moving a heated substrate past a coating apparatus embodying features of the invention may be used in the practice of the invention.

In general and not limiting to the invention, the ribbon 22 has a thickness range from about 0.08 inch to about 0.50 inch (about 2 to about 13 millimeters) and moves at speeds of about 700 to about 100 inches (about 17.80 meters to about 2.54 meters) per minute, respectively. The molten tin bath 24 has a temperature in the range of about 1000° F. (538° C.) to about 2000° F. (1094° C.).

The apparatus 20 includes an elongated coating unit 25, two elongated exhausts 28 and 26, one on each side of the coating unit 25, and two elongated discharge units 31 and 32, one on each outboard side of an exhaust as shown in FIG. 3. The term "elongated" as used herein means that the coating unit, exhausts and discharge units extend across the width of the ribbon i.e. transverse to the movement of the ribbon 22. The discharge units 31 and 32 provide an inert gas curtain to prevent the coating vapors from the coating zone, i.e. the zone between the discharge units 31 and 32, from moving into the chamber atmosphere and also to prevent the chamber atmosphere from moving into the coating zone. As can be appreciated the separation between the coating zone and chamber atmosphere is required because the atmosphere in the coating zone as will be discussed is an oxidizing atmosphere, and the chamber atmosphere as discussed above is a non-oxidizing atmosphere. In the practice of the invention, the inert gas was nitrogen.

The exhausts 26 and 28 in accordance with the teachings of the invention are not equally spaced from the coating unit 25. More particularly, with the glass ribbon moving from left to right as shown in FIG. 3, the exhaust 28 is closer to the coating unit 25 than the exhaust 26. By positioning the exhausts at different distances from the coating unit the coating vapors are in contact with the ribbon surface for different periods of time. Therefore, all other parameters being equal, e.g., glass temperature, spacing between the coating unit and glass ribbon surface and exhaust pressures, a thicker coating will be deposited on the ribbon as it passes between the exhaust 26 and the coating unit 25, than between the coating unit 25 and the exhaust 28. This feature of the invention will be more fully appreciated in the discussion of the coating system 19 shown in FIG. 2.

As can now be appreciated, the design of the discharge units 31 and 32, the exhausts 26 and 28 and coating unit 25 are not limiting to the invention. The invention has been practiced using the exhausts 26 and 28 with an elongated opening 36 connected to a collection chamber 38 and using the discharge units 31 and 32 with an elongated opening 50 connected to a discharge chamber 46. The inert gas has uniform pressure and constant velocity along the length of the opening 50 to provide a curtain of inert gas, a portion of which flows into the chamber (not shown) atmosphere and a portion toward the adjacent exhaust 26 or 28 as shown in FIG. 3.

The coating unit 25 includes a discharge chamber 56. The coating vapor exits the chamber 56 by way of elongated opening 58 and is directed toward the surface of the glass ribbon 22 passing beneath the opening 58. The coating vapor has a uniform pressure and constant velocity along the length of the opening 58 and has sufficient pressure to allow a portion of the coating vapor to flow upstream and a portion to flow downstream as viewed in FIG. 3.

The amount of nitrogen typically introduced by each discharge unit 31 and 32 ranges from about 20 to about 300 standard cubic feet per minute for a ribbon having a width of about 160 inches (4.06 meters). As can be appreciated the flow rate of the nitrogen is not limiting to the invention; however, it should be sufficient to provide an inert curtain separating the coating zone and the chamber atmosphere.

The openings 36 of the exhausts 26 and 28 and the exhaust pressure is adjusted to exhaust a portion of the inert gas from the adjacent discharge unit 31 and 32, respectively, and a portion of the coating vapor from the coating unit 25. As seen in FIG. 3 and as discussed above, the exhaust 26 is spaced further from the coating unit 25 than the exhaust 28. With this arrangement and maintaining the exhaust pressure the same for each exhaust unit, the coating vapor residence time is greater for the glass ribbon 22 as it moves from the exhaust 26 toward the coater unit 25 than for the glass ribbon as it moves from the coater unit 25 toward the exhaust 28.

Although the above asymmetric arrangement is preferred, because of the simplicity thereof, the invention is not intended to be so bound, since the discovery herein resides in the fact that having different coating vapor residence times on different sides of a coater unit alters the final composition of the coating. Therefore, other apparatuses or processes suitable for obtaining such an effect can be used. It has been determined that the same effect achieved with asymmetrically arranged exhausts, as discussed above, can also be achieved, even with symmetric spacing of the coating unit 25 and the exhausts by, for example, adjustment of the height or level of the openings 36 of the exhausts 26 and 28 relative to one another and to the glass ribbon. Another method to vary the coating vapor residence time is to vary the ratio of the flow of the exhaust 26 to the exhaust 28.

By way of illustration only, in the instance when the spacing between the coating unit 25 and exhausts 26 and 28 is symmetrical, reducing the pressure of the exhaust 26 below the pressure of the exhaust 28, results in the coating vapor residence time between the coating unit 25 and exhaust 26 being greater than the coating vapor residence time between the coating unit 25 and the exhaust 28.

Referring now to FIG. 2, the coating system 19 was used to apply the coating 14 of the coated article 10 shown in FIG. 1. The coating system 19 includes a coating station 59 for applying a compositionally graded coating and coating station 60 for extending the thickness of the predominantly tin oxide region at the surface 18 of the coating 14 (see FIG. 1). The coating station 59 includes coating units 61, 62 and 64, exhausts 66, 68, 70 and 72 and discharge units 31 and 32.

The coating station 60 is not limiting to the invention; however the coating station used in the practice of the invention was the type of coating apparatus disclosed in U.S. Pat. No. 4,853,257 which teachings are hereby incorporated by reference. Opening 50 of the discharge unit 31 is spaced about 25 inches (63.5 centimeters) from opening 50 of the discharge unit 32; opening 74 of the exhaust 66 is spaced about 22-½ inches (57 centimeters) from the opening 50 of the discharge unit 32; opening 76 of the coating unit 61 is spaced about 20 inches (51 centimeters) from the opening 50 of the discharge unit 32; opening 78 of the exhaust 68 is spaced 17-½ inches (44.5 centimeters) from the opening 50 of the discharge unit 32; opening 80 of the coating unit 62 is spaced about 12-½ inches (32 centimeters) from the opening 50 of the discharge unit 32; opening 82 of the exhaust 70 is spaced about 10 inches (25.4 centimeters) from the opening 50 of the discharge unit 32; opening 84 of the coating unit 64 is spaced about 5 inches (12.7 centimeters) from the opening 50 of the discharge unit 32, and opening 86 of the exhaust 72 is spaced about 2-½ inches (6 centimeters) from the opening 50 of the discharge unit 32. The coating station 60 was spaced about 6 feet (1.8 meters) from the discharge unit 32.

The openings 50, 74, 76, 78, 80, 82, 84, and 86 were spaced, in a convenient manner, about 0.2 inches (0.51 centimeter) above the upper surface of the glass ribbon 22 as viewed in FIG. 2. The length of the openings 50 was about 25 inches (64 centimeters); the length of the openings 74, 78, 82 and 86 was about 25 inches (64 centimeters) and the length of the openings 76, 80 and 84 was about 21 inches (53.34 centimeters). The width of the openings 50 was about 0.125 inch (0.32 centimeter); the width of the openings 74, 78, 82 and 86 was about 0.250 inch (0.64 centimeter) and the width of the openings 76, 80 and 84 was about 0.06 inch (0.15 centimeter). The flows of nitrogen and coating vapor were about 350 to about 700 SLPM (standard liters per minute). The exhaust flow was about 375 to about 770 SLPM. The glass ribbon speeds were between about 200–700 inches (5.08–17.78 meters) per minute, the temperature of the glass ribbon moving into, through and out of the coating stations 59 and 60 was between about 1170°–1250° F. (635°–675° C.).

The coating system 19 and in particular the coating station 59 and the method associated therewith are especially effective for the chemical vapor deposition (CVD) of coatings from mixtures of silicon and metal containing precursors to provide the article 10 shown in FIG. 1.

In the following discussion, the coating 14 is made from a mixture of tin containing precursors and silicon containing precursors capable of being volatilized and converted to their corresponding oxides in the presence of oxygen at temperatures in the range of about 750° to about 1500° F. (about 400° C. to about 815° C.). As will be appreciated the invention is not limited thereto and other metal containing precursors may be used with the coating apparatus and in the coating processes discussed above.

Examples of silicon compounds that may be used in the practice of the invention include, but are not limited to, tetraethoxysilane, silane, diethylsilane, di-t-butoxydiacetoxysilane, trichloroethoxysilane, trichloropropoxysilane, ethoxysilane, chloroethoxysilane, dichloroethoxysilane, tri-(trichloromethyl)ethoxysilane, di-(pentachloroethyl)ethoxysilane, di-(trichloromethyl)ethoxysilane, tri-(pentachloroethyl)ethoxysilane, pentachloroethylethoxysilane, trichloromethylethoxysilane, trichloromethylpropoxysilane, trichloromethyldichloroethoxysilane, pentachloroethylchloroethoxysilane, dimethylmethoxysilane, dimethylchloromethoxysilane, trichloromethoxysilane, tetramethyldisiloxane, tetramethyldichlorodisiloxane and the silicon compounds disclosed in U.S. Pat. No. 3,378,396 to Zaromb and U.S. Pat. Nos. 4,187,336, 4,308,316, 4,377,613, 4,419,386, 4,206,252, 4,440,822, and 4,386,117, which are incorporated herein by reference.

Compounds that have been used in the practice of the invention include diethylsilane, tetramethoxysilane, tetraethoxysilane, tetraisopropoxysilane, diethyldichlorosilane, tetramethylcyclotetrasiloxane and triethoxysilane.

In addition to the silicon containing precursors discussed above, the invention contemplates silicon containing precursors that can be converted to their corresponding silicon oxides and can be used in admixture with the metal containing precursors to form the desired coating on a substrate e.g. a glass substrate having a coating with the desired mixed oxide gradient.

Silicon compounds vary in reactivity from silane, with four silicon-hydrogen bonds, which is explosive, to tetraethoxysilane, with four silicon-oxygen bonds, which is very stable and reacts very slowly. In accordance with the present invention, silicon compounds are selected which are relatively stable in the gas phase prior to forming of the coating, but decompose rapidly at the substrate surface to form silicon oxide. The present invention provides silicon compounds having the desired degree of reactivity for depositing silicon oxide.

When looking for a silicon containing precursor to form a silicon oxide coating, one skilled in the art would not normally choose a precursor having an Si—O bond because it is one of the strongest bonds in nature to break, as is evidenced by the stability of the mineral quartz ($SiO_2$). Therefore breaking the Si—O bond in the precursor and rearranging it into a network lattice containing the silicon oxide bonds desired for a coating is difficult e.g. the siloxane bond requires high temperature and/or long periods of time to form a corresponding silicon oxide coating. For this reason silicon containing precursors having the siloxane structure would not be expected by one skilled in the art to be useful in the formation of a silicon oxide coating on a moving substrate.

It has been determined, however, that if a compound carrying an Si—O bond also carries at least one specific functional group, the reactivity of the silicon containing precursor having the Si—O bond, and therefore its coating formation rate, will be increased, even though the bond strengths would not seem to indicate any appreciable change in its coating formation behavior. The functional groups that are capable of giving the silicon containing precursor containing an Si—O bond the ability to be easily converted to a silicon oxide coating include hydrogen, halogens, alkynyls, alkenyls and alpha, beta or gamma-halogenated and perhalogenated alkyls. These functional groups increase the reactivity of the silicon compounds by withdrawing electron density away from the silicon atom and thereby weakening the bond between said functional group and the silicon atom. The hybridization of the alkene or alkyne bonding results in increased electronegativity relative to the alkanes, which causes the withdrawal of negative electronic charge from the silicon atom. In the case of the halogenated alkyls, the halogens have an inductive effect and are the negative electron charge withdrawing components. When the halogens are bonded directly to the silicon atom, they withdraw the negative charge directly. The weakened bond is then easier to break thermally under pyrolyric deposition conditions, thereby increasing the deposition rate of silicon oxide.

Furthermore, the activation energy of the reaction, which determines the rate of the reaction, is altered by the functional groups present on the silicon atoms. The increased partial positive charge on the silicon atom makes it much more susceptible to nucleophilic attack, while the enhanced partial negative charge on the functional group makes the functional group more susceptible to electrophilic attack. This redistribution of the electronic charge and the subsequent enhanced reactivity of the silicon precursors of the instant invention also makes them susceptible to acceleration by compounds that exploit the chemical reactivity imparted by the redistributed electronic charge.

The reaction activation energy is dependent on the path of the reaction. The use of accelerants in the form of electrophiles and nucleophiles assist in altering these reaction pathways by forming lower energy reaction intermediates with the silicon atom and functional groups that boost the overall reaction rate. Such accelerants may also be employed with other precursor compounds that are susceptible to similar electrophilic or nucleophilic attack. The reactivity of the silicon containing precursor can thus be tailored by the appropriate choice of functional groups. The silicon containing precursor of the instant invention is not limited to having only the above-defined substituents thereon. As long as one or more of the above-defined functional groups is present on the silicon containing precursor carrying the Si—O bond, other groups, such as alkyls and other substituents more fully defined below, can also be present without a significant deleterious effect on the overall reactivity of the silicon containing precursor.

Compounds bearing the Si—O bond can be exemplified by reference to the structure

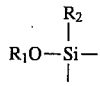

which may be present in compounds having the following structural formulae I, IV, V and VI:

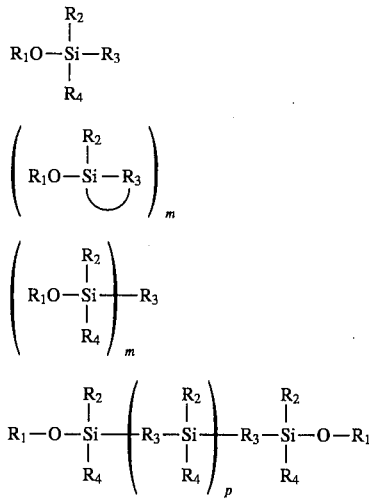

wherein m is from 2 to 7; $R_1$ is selected from the following Group A which consists of compounds that do not have an oxygen available to form the peroxide bond:

alkyl, or substituted alkyl, radicals having from 1 to 10, preferably 1 to 4, carbon atoms, such as —$CH_3$, —$CH_2CH_2CH_3$ and —$CH_2CH_2OH$;

halogenated or perhalogenated alkyl radicals having from 1 to 10, preferably 1 to 4, carbon atoms, such as —$CCl_3$, $CH_2CHClCH_3$ and $CH_2CCl_2CCl_3$;

alkenyl or substituted alkenyl radicals having from 2 to 10, preferably 2 to 4, carbon atoms, such as —CH=$CHCH_3$ and —CH=$CH_2$;

alkynyl or substituted alkynyl radicals having from 2 to 10, preferably 2 to 4, carbon atoms, such as —C≡C—$CH_3$ and —C≡CH; and aryl or aralkyl or substituted aryl or aralkyl radicals having from 6 to 11, preferably 6 to 9, carbon atoms, such as —$C_6H_5$ and —$C_6H_4CH_3$;

wherein $R_2$ are functional groups that form a bond with the Si atom which is easily thermally broken e.g. at temperatures between about 200° F.–800° F. (about 93.5° C.–445° C.) and preferably between about 400° F.–700° F. (205° C.–370° C.). The functional group ($R_2$) capable of giving the silicon containing precursor the ability to be easily converted to a silicon oxide coating is selected from Group B consisting of:

hydrogen;

halogen, preferably Cl;

alkenyl or substituted alkenyl radicals as defined in Group A for $R_1$;

α-halogenated alkyl or perhalogenated alkyl, and alkynyl or substituted alkynyl radicals as defined in Group A for $R_1$;

wherein $R_3$ is a bridging group to provide for multiple silicon atom compounds. $R_3$ is selected from Group C consisting of:

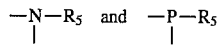

wherein $R_5$ is an alkyl or substituted alkyl radical having from 1 to 10, preferably 1 to 4, carbon atoms, such as —$CH_2CH_3$ or —$CH_2CH_2CH_3$;

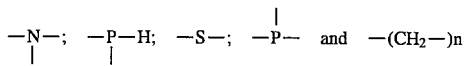

where n is 1 to 10, preferably 1 to 4, and wherein $R_4$ completes the bonding on the foundation silicon atom. $R_4$ is selected from the Groups A and B above and the following Group D consisting of:

alkoxide or substituted alkoxide radicals having from 1 to 10, preferably 1 to 4, carbon atoms, such as —$OCH_2CH_3$; alkyl or substituted alkyl radicals having from 1 to 10, preferably 1 to 5, carbon atoms, such as —$CH_2CH_3$;

—CN;

—OCN, and

—$PH_2$;

alkylphosphines, and dialkylphosphines, wherein the alkyl radical has from 1 to 10, preferably 1 to 4, carbon atoms, such as —$PHCH_3$ and —$P(CH_2CH_3)_2$.

Substituents for Groups A, B and D discussed above, can be selected from following Group E consisting of:

an alkoxide radical having from 1 to 10, preferably 1 to 4, carbon atoms, such as —$OCH_2CH_2CH_2CH_3$;

an alkyl radical having from 1 to 10, preferably 1 to 4, carbon atoms, such as —$CH_2CH_2CH_3$;

a halogen or a halogenated alkyl radical having from 0 to 10, preferably 0 to 4, carbon atoms, such as Cl or —$CCl_3$;

an alkenyl radical having from 2 to 10, preferably 2 to 4, carbon atoms, such as —CH=CH$_2$;

an alkynyl radical having from 2 to 10, preferably 2 to 4, carbon atoms, such as —C≡CH;

an aryl or aralkyl radical having from 6 to 11, preferably 6 to 9, carbon atoms, such as
—C$_6$H$_5$;
—CN;
—OCN;

phosphine, alkylphosphine, and dialkyl phosphine radicals, wherein the alkyl group has from 1 to 10, preferably 1 to 4, carbon atoms, such as —PH$_2$, —PHCH$_3$, —P(CH$_2$CH$_3$)$_2$, and —OH.

A variety of compounds can be formed from these structural formulae. When a molecule containing a single silicon atom is desired, R$_3$ can be selected from Groups A, B or D. When multi-silicon atom molecules are desired, R$_3$ is a bridging group. In the multi-silicon atom molecule case, R$_3$ connects two silicon atoms directly. When the multi-silicon atom molecules are cyclic, R$_4$ is not present on any of the silicon atoms. When the multi-silicon molecules are straight or branched chain molecules, the R$_4$ groups are present only on the silicon atoms in the terminating position in the chain. When molecules with more than two silicon atoms are desired, the bridging groups, R$_3$, can be the same or different. In any case, where any functional group R appears more than once in a compound formula, each occurrence of R may be independently selected from the appropriate group.

Another type of bonding is possible to create multi-silicon atom molecules with Si—O—Si bonds. In this case, R$_1$ is no longer selected from Group A and is instead another silicon bearing group from base structure I with the continued requirement of having an R$_2$ selected from Group B. The bonding between the silicon bearing groups is chosen so that a direct Si—O—Si bond is formed. If a molecule with more than two silicon atoms is desired, R$_4$ is only present on the terminating silicon atoms as described above. R$_3$ can now be selected from Groups A, B, C or D. By selecting R$_3$ from Group C we can create multi-silicon atom molecules with different bridging groups, i.e., Si—O—SI—N—Si.

As can now be appreciated, simple or complex silicon containing precursors are possible. The only requirement remains that each silicon atom have bonded directly to it an oxygen atom and a functional group selected from Group B.

Specific compounds that have been used in the practice of the invention include tetramethylcyclotetrasiloxane, tetramethyldisiloxane and triethoxysilane. Specific compounds that may be used in the practice of the invention, but not limiting thereto, are methyldimethoxysilane, dimethylmethoxysilane, trimethoxysilane, dimethylchloromethoxysilane, methylchlorodimethoxysilane, chlorotrimethoxysilane, dichlorodimethoxysilane, trichloromethoxysilane, triethoxysilylacetylene, trimethylpropynylsilane, tetramethyldisiloxane, tetramethyldichlorodisiloxane, tetramethylcyclotetrasiloxane, triethoxysilane, chlorotriethoxysilane, pentachloroethyltriethoxysilane and vinyltriethoxysilane.

A variety of compounds can be formed from the structural formulae I, IV, V and VI. Single silicon atom molecules are formed using structure I. The structures IV, V and VI constitute multi-silicon atom compounds. Structure IV represents cyclic multi-silicon atom compounds; structure V represents branched multi-silicon atom compounds; and structure VI represents linear multi-silicon atom compounds. All of these silicon compounds comprise a silicon-oxygen bond and the rate enhancing functional groups previously described. The functional groups for these molecules are independently selected from the appropriate group, so that when more than one functional group occurs in a compound, each occurrence may be different. Examples of compounds using structures I, IV, V and VI are: trichloroethoxysilane; trichloropropoxysilane; ethoxysilane; chloroethoxysilane; dichloroethoxysilane; tri(trichloromethyl)ethoxysilane; di-(pentachloroethyl)ethoxysilane; di-(trichloromethyl)ethoxysilane; tri-(pentachloroethyl)ethoxysilane; pentachloroethylethoxysilane; trichloromethylethoxysilane; trichloromethylpropoxysilane; trichloromethyldichloroethoxysilane; pentachloroethylchloroethoxysilane; dimethylmethoxysilane; dimethylchloromethoxysilane; trichloromethoxysilane; tetramethyldisiloxane; tetramethyldichlorodisiloxane; 1,3-bis(chloromethyl)1,3-diethoxy1,3-dimethyldisilazane; 1,3-bis(chloromethyl)1,3-diethoxy1,3-dimethyldisiloxane; 1,3-bis(trichloromethyl)1,3-diethoxy1,3-dimethyldisilazane; 1,3-bis(trichloromethyl) 1,3-diethoxy1,3-dimethyldisiloxane; 1,3,5,7-tetraethoxycyclotetrasiloxane; 1,3,5,7-tetraethoxycyclotetrasilazane; 2,5-dimethyl, 2,5-diethoxy, 2,3-disilaloxacyclopentane; and 1,3,5,7-tetraethoxycyclotetrasilazane.

Specific compounds that may be used in the practice of the invention, but not limiting thereto, are dimethylmethoxysilane, dimethylchloromethoxysilane, trichloromethoxysilane, tetramethyldichlorodisiloxane, trichloroethoxysilane, trichloropropoxysilane, ethoxysilane, chloroethoxysilane, dichloroethoxysilane, tri-(trichloromethyl)ethoxysilane, di-(pentachloroethyl)ethoxysilane, di-(trichloromethyl)ethoxysilane, tri-(pentachloroethyl)ethoxysilane, pentachlorethylethoxysilane, trichloromethylethoxysilane, trichloromethylpropoxysilane, trichloromethyldichloroethoxysilane, pentachloroethylchloroethoxysilane, dimethylmethoxysilane, dimethylchloromethoxysilane, trichloromethoxysilane, tetramethyldisiloxane, and tetramethyldichlorodisiloxane.

Metal containing precursors that can be used in admixture with the silicon containing precursors defined above in the chemical vapor deposition of mixed oxides on a glass substrate include metal containing precursors that are vaporizable at or below about 500° F. (260° C.) and that will react with an oxygen-containing gas to form the corresponding metal oxides. Preferably, but not limiting to the invention, compounds that may be used include organometallic compounds containing metals including but not limited to titanium, vanadium, chromium, manganese, iron, cobalt, nickel, copper, zinc, gallium, germanium, arsenic, selenium, yttrium, zirconium, niobium, molybdenum, cadmium, rhodium, ruthenium, palladium, indium, antimony, tellurium, tantalum, tungsten, platinum, lead, bismuth, aluminum, and tin. Of these metal compounds, tin, titanium, zinc, antimony, aluminum, tungsten, tantalum, zirconium and indium compounds are most preferred. Examples of metal compounds useable herein include those defined by the following structural formula VII:

   VII where q is the valence of M, and each R$_{22}$ is independently selected from the group consisting of alkyl, substituted alkyl, halogen, hydrogen, alkoxide, substituted alkoxide, aryl, substituted aryl and acetylacetonate radicals. Of these metal compounds, tin compounds are most preferred. Examples of tin compounds useable herein include those defined by the following structural formula II:

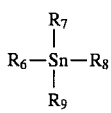

wherein $R_6$, $R_7$, $R_8$, and $R_9$ are the same or different and include but are not limited to halogens preferably Cl or F, an alkyl radical having from 1 to 10, preferably 1 to 4, carbon atoms, such as —$CH_3$, an aryl group having from 6 to 11, preferably 6 to 9, carbon atoms, such as —$C_6H_5$. In the practice of the invention any other organic or inorganic functional group can be used provided the vapor pressure of the resultant compound is at least 0.01 pounds per square inch absolute, below about 500° F. (260° C.).

The silicon containing precursors defined above, including those bearing the Si—O bond, can be used alone, or they can be used in admixture with the organometallic compounds discussed above in the chemical vapor deposition of the corresponding single or mixed oxides on a glass substrate. However, when the silicon containing precursor is used alone, or in admixture with other metal containing precursors, in the chemical vapor deposition of single or mixed oxides onto a moving substrate e.g. coating a ribbon of glass advancing along a molten metal bath or on a conveyor, it is desirable to have a rate of silicon oxide deposition sufficient to coat the moving glass substrate. For example, when coating an advancing glass ribbon and the deposition rate of silicon oxide is relatively low, the glass ribbon speed has to be reduced. More particularly, to deposit about a 1200 Å thick coating on a glass ribbon moving at a line speed of greater than about 300 inches (7.62 meters) per minute, the rate of deposition of all classes of silicon containing precursors used in the chemical vapor deposition processes has to be increased to attain a uniform coating.

A number of materials have been identified that can be used to accelerate the deposition rate of silicon oxides from their precursors. These accelerants are broadly categorized as electrophiles or nucleophiles, because their purpose is to interact with the electron deficient silicon atom or electron rich functional group of the silicon compounds of the present invention. The capability of the accelerant to lower the activation energy of the deposition reaction makes such accelerants useful in combination with other silicon or metal containing compounds susceptible to electrophilic or nucleophilic attack for the deposition of silicon oxide or other metal oxide. Since the functional characteristic of the accelerants relates to its electrophilic or nucleophilic capability, broad classes of compounds such as Lewis acids or Lewis bases may be used as accelerants. In addition, metal compounds that behave as Lewis acids or bases, or generate Lewis acids or bases as decomposition products may also be useful as accelerants. The type and functionality of each accelerant depends to some extent on the silicon containing precursors with which it will be used. Combinations have been determined for a specific coated article and for the process used to deposit the desired coating, in particular, the mixed oxide of the invention. It has further been determined that a synergistic effect occurs between certain combinations of precursors and accelerants that result in a beneficial altering and control of the morphology of the coating.

Accelerants that can be used in the practice of the invention to increase the deposition rate of silicon oxide alone or in combination with another oxide, for example, tin oxide or other metal-containing compound, can be defined as follows:

(1) Lewis Acids, such as trifluoroacetic acid, hydrochloric acid, formic acid and acetic acid.

(2) Lewis Bases, such as NaOH, NaF, $CH_3OH$, $CH_3OCH_3$ and $S(CH_3CH_2)_2$.

(3) Water.

(4) Compounds of nitrogen, phosphorus, boron, sulfur and selenium having the following structural formulae:

wherein Y is selected from the group consisting of nitrogen, boron and phosphorus and $R_{10}$, $R_{11}$, $R_{12}$, $R_{13}$ and $R_{14}$ are selected from the following list of functional groups, hereinafter referred to as Group F:

hydrogen;

halogens, preferably Cl;

alkenyl or substituted alkenyl radicals having from 2 to 10, preferably 2 to 4, carbon atoms, such as —$CH=CH_2$;

perhalogenated alkyl or substituted alkyl radicals having from 1 to 10, preferably 1 to 4, carbon atoms, such as -$CClH_2$ or halogenated alkyl or substituted alkyl radicals having from 1 to 10, preferably 1 to 4, carbon atoms, such as —$CCl_2CH_2CH_3$;

acyloxy radicals having from 1 to 10, preferably 1 to 4, carbon atoms, such as —$OCOCH_3$;

alkynyl or substituted alkynyl radicals having from 2 to 10, preferably 2 to 4, carbon atoms, such as —$C≡CH$;

alkyl or substituted alkyl radicals having from 1 to 10, preferably 1 to 4, carbon atoms, such as —$CH_3$, —$CH_2CH_2CH_3$;

aryl or substituted aryl radicals having from 6 to 10, preferably 6 to 9, carbon atoms, such as —$C_6H_4CH_3$;

alkoxide or substituted alkoxide radicals having from 1 to 10, preferably 1 to 4, carbon atoms, such as —$OCH_2CH_2CH_3$;

wherein said substituents are from Group E discussed above, examples of which compounds include but are not limited to triethylphosphite, trimethylphosphite, trimethylborate, $PF_5$, $PCl_3$, $PBr_3$, $PCl_5$, $BCl_3$, $BF_3$, $(CH_3)_2BBr$, $SF_4$ and $HO_3SF$. In the practice of the invention triethylphosphite was used.

(5) Compounds of aluminum having the following structural formula III may be used to accelerate the deposition rate of silicon containing precursors alone or in combination with other metal containing precursors (the "other metal containing precursors", as can be appreciated, do not include aluminum containing precursors):

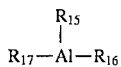
(III)

wherein $R_{15}$, $R_{16}$, and $R_{17}$ are the same or different and are selected from the following Group G:
hydrogen;
halogens, preferably Cl;
—O—$R_{17}$, wherein $R_{17}$ is a linear, branched or substituted alkyl radical having from 1 to 10 carbon atoms, preferably 1 to 4, with substituents selected from Group E discussed above;
—S—$R_{18}$, where $R_{18}$ is equivalent to $R_{17}$ defined above;
—$NH_2$;
$R_{19}$—N—$R_{20}$, wherein $R_{19}$ and $R_{20}$ are linear or branched alkyl groups, or substituted alkyl groups having from 1 to 10, preferably 1 to 4, carbon atoms, with substituents selected from Group E discussed above; (less the phosphine groups, such as —$PH_2$); and N $R_{21}$, wherein $R_{21}$ forms cyclic group having from 2
to 10 preferably 2 to 6 carbon atoms, with substituents selected from Group E discussed above (less the phosphine groups).
(6) Ozone.

The mechanism that causes the accelerants of the invention to increase the rate of deposition is not completely understood. Even though the mechanism is not completely understood the results, discussed below, clearly demonstrate that the mixed oxide coating deposition rate was increased. With reference to Table 2 in Example I below, Run Nos. 11 and contain the accelerant triethylphosphite. The growth rate of the silicon oxide coating was at least twice the rate of the silicon oxide coating of Run No. 2 that did not have an accelerant.

A moving glass substrate was coated using the same precursor chemistry as used in Run Nos. 11 and 12 of Table 2 and similar deposition rates resulted. The precursors were vaporized at a temperature of about 150° F. (65° C.) to about 500° F. (260° C.), and the gaseous mixture of the precursors, oxygen containing gases, and carrier gas and accelerant, were brought into contact with a glass ribbon supported on a molten metal bath and heated to a temperature of about 950° F. (510° C.) to about 1350° F. (730° C.). The glass ribbon advanced at a speed of about 170 to 730 inches (4.25 to 18.00 meters) per minute.

The amounts of the components that may be used in the practice of the invention are defined below in Table 1.

TABLE 1

| | Mole Percent | |
|---|---|---|
| Compound | Broad Range | Preferred Range |
| Metal Containing Precursor | 0.005 to 5.0 | 0.1 to 2.0 |
| Silicon Containing Precursor | 0.0001 to 5.0 | 0.05 to 2.0 |
| Oxygen-Containing Gas | 1.0 to 99.0 | 5.0 to 50.0 |
| Accelerant | 0.0001 to 10.00 | 0.01 to 2.0 |

When the substrate 12 (see FIG. 1) e.g. glass substrate is subjected to chemical vapor deposition of mixed oxides, for example, a mixture of silicon oxide and tin oxide, to obtain the coating 14 thereon in accordance with the process of the invention, the coating 11, as discussed above, is characterized by having a continuously varying composition as the distance from the glass-coating interface 16 increases, resulting in a substantial reduction of iridescence in the coated product. Assuming a coating composed of substantially silicon oxide and tin oxide, that portion of the coating adjacent to the glass-coating interface 16 is composed largely of silicon oxide and as the distance from the glass-coating composition increases, each succeeding region of the continuously varying composition contains a silicon oxide to tin oxide ratio that varies as the distance from the glass-coating interface increases. More particularly, the percent of silicon oxide decreases as the percent of tin oxide increases, so that as the opposite surface 18 is reached, the region is composed predominantly of tin oxide. Thereafter the thickness of the region of predominantly tin oxide may be increased to reduce the emissivity of the coated article.

It has been determined that when chemical vapor deposition of mixed oxides on a glass substrate is carried out with the addition of one or more of the accelerants of the instant invention e.g. compounds of phosphorus, aluminum, or boron, a small amount of the foundation atom e.g. phosphorus, aluminum or boron is found dispersed in the coating 14. The presence of phosphorus, aluminum and/or boron in the coating affects the morphology of the resultant coating so that the aforementioned continuously changing components have a decreased probability of forming strata with discrete composition e.g. layers that have a fixed ratio of silicon oxide to tin oxide for thicknesses greater than about 70 Å. Additionally, the presence of phosphorus, aluminum and/or boron affects the morphology of the resultant coating by decreasing the percent crystallinity (approaching 0% crystallinity) and thereby reduces the light scattering properties which can be observed as haze. The amount of the phosphorus, aluminum or boron compound incorporated in the layer is a function of process variables. In the practice of the invention a glass ribbon moving at speeds between 175 to 730 inches (425 to 1800 centimeters) per minute, and having a temperature in the range of 1180° F. (637° C.) to 1220° F. (660° C.) was coated with a gaseous mixture having a phosphorus compound as an accelerant; the mole fraction of the accelerant was 0.01 to 0.5. One to 12 atomic percent of phosphorus was found dispersed in the coating. The invention encompasses using an amount of accelerant greater than 0 and up to 15 atomic percent with a preferred range of 1 to 5 atomic percent.

The present invention will be further appreciated and understood from the description of specific examples which follow:

EXAMPLE I

A number of compositions were prepared from silicon containing precursors and monobutyltinchloride to illustrate the increased growth rate of mixed oxide films on a glass substrate in accordance with the teachings of the invention. In each composition, monobutyltinchloride was used with different silicon containing precursors. The precursors were vaporized, when necessary, and the resulting gaseous mixture of precursors, oxygen and nitrogen, were introduced into a quartz tube that was electrically heated and controlled to maintain a temperature of 300° F. (150° C.). The concentration of the silicon containing precursors was in all instances 0.30 mole percent, the monobutyltinchloride 0.50 mole percent, oxygen 21 mole percent, with the remainder nitrogen. The velocity of the precursors and carrier gas was maintained at a rate of 30 centimeters per second in the quartz tube. This gas mixture was passed over a glass substrate heated to about 1200° F. (650° C.), for 3 to 30 seconds after which the spent gas mixture was vented into a chemical hood. The film thickness for all the runs except Run No. 8 discussed below was measured using a Tencor P1 profilometer. The film growth rate was calculated by dividing film thickness by the coating time. The data obtained are set forth below in Table 2.

TABLE 2

| Run No. | Silicon Containing Precursors | Growth Rate, Å/Second |
| --- | --- | --- |
| 1 | diethylsilane | 129 |
| 2 | tetraethoxysilane | 43 |
| 3 | di-t-butoxydiacetosilane | 64 |
| 4 | tetramethylcyclotetrasiloxane | 181 |
| 5 | tetramethylcyclotetrasiloxane | 205 |
| 6 | tetramethylcyclotetrasiloxane | 177 |
| 7 | tetramethyldisiloxane | 164 |
| 8 | ethyltriacetoxysilane | 110* |
| 9 | triethoxysilane | 139 |
| 10 | methyldiacetoxysilane | 32 |
| 11 | tetraethoxysilane + 0.31 mole percent triethylphosphite | 136 |
| 12 | tetraethoxysilane + 0.09 mole percent triethylphosphite | 87 |

*estimated

Run No. 1 was used as the control because the diethylsilane is generally accepted as having an acceptable rate of deposition.

The tetramethylcyclotetrasiloxane precursors used in Run Nos. 4, 5 and 6 were obtained from different suppliers. Run Nos. 2, 3 and 10 using silicon containing precursors having an Si—O bond without the accelerants or the functional groups of the instant invention had an expected low growth rate. Run Nos. 4, 5, 6, 7 and 9 which had a Si—O bond with the functional group of the instant invention had a deposition rate equal to or better than the control Run No. 1. Additionally Run No. 2 when augmented with an accelerator as taught in the instant invention (see Run Nos. 11 and 12) exhibited a deposition rate greater than Run No. 2 and approaching (Run No. 12) or exceeding (Run No. 11) the deposition rate of control Run No. 1.

Run No. 8 is a compound having the Si—O bond that does not contain a functional group or accelerant of the instant invention; however, it showed a deposition rate equal to the control Run No. 1. The film quality of Run No. 8 was extremely poor and the film thickness had to be estimated using interference colors which was different from the measuring technique used for Run Nos. 1–7 and 9–12.

EXAMPLE II

Two runs were carried out showing the advantages obtained using an asymmetric coater configuration of the instant invention in place of a symmetric coater configuration. Referring to FIG. 3, in one run the exhausts 26 and 28 were positioned relative to the coating unit 25 such that x/y=2 where "x" is the distance between the exhaust 28 and the coating unit 25 and "y" is the distance between the coating unit 25 and the exhaust 28, while in the other embodiment, the exhausts 26 and 28 were positioned relative to the coating unit 25 such that x/y=1. The coating composition vapor was maintained at 337° F. (166° C.) and contained 1.2 mole percent monobutyltinchloride, 0.3 mole percent tetraethoxysilane, 0.5 mole percent triethylphosphite, 1.0 mole percent water, 20 mole percent oxygen, and the balance nitrogen. The soda-lime-silica float glass ribbon supported by and moving along a molten metal bath had a thickness of about 0,118 inch (0,300 centimeter), a temperature of about 1200° F. (650° C.), and a line speed of 510 inches (13 meters) per minute. The surface of the openings of the nitrogen curtain provided by the discharge units 31 and 32 and the exhausts 26 and 28 were maintained at a height of about 0.22 inch (0.55 centimeter) above the surface to be coated of the glass ribbon 2.

The tin depth profile of a film produced on the glass ribbon using both the asymmetric and symmetric coater configurations is shown in the graph in FIG. 4. The film analysis was accomplished using the Rutherford Backscattering Spectrometry (RBS) technique for purposes of comparing the gradient film produced by the two coater configurations. The RBS spectra in FIG. 4 were taken at a special angle in order to obtain optimum depth resolution of the tin atom distribution through the film.

A comparison of the asymmetric coater configuration (shown by solid line 210) with that of the symmetric coater configuration (shown by dotted line 212) is shown in the RBS spectra in FIG. 4. Of significance between the two tin depth profiles 210 and 212 is the extended region of the tin signal from 2025 keV at 3.7 relative counts down to 1890 keV at 1.4 relative counts as compared to the symmetric coater which has its tin signal varying from 2025 KeVC at 3.6 relative counts down to 1940 keV at 1.4 relative counts. This difference shows an increase in film thickness for an asymmetric coater configuration. As can be seen from FIG. 4 the asymmetric coater configuration provides the gradient coating with an extended range of varying composition.

EXAMPLE III

A series of runs was carried out using the coating apparatus 20 of FIG. 3 where the exhausts 26 and 28 were positioned relative to the coating apparatus 20 such that x/y=1. The coating composition vapor was maintained at 320° F. (165° C.) and contained 0.8 mole percent monobutyltinchloride, 0.3 mole percent tetraethoxysilane, 0.1 mole percent triethylphosphite, 0.54 mole percent water, with the balance air. The total gas flow and coater height were varied while the concentrations were held constant. The results obtained are set forth in the process contour chart in FIG. 5. By altering coater height in inches and carrier flow in standard liters per minute, the boundary layer conditions are altered in the coating zone thereby altering the relative ratio of tin oxide and silicon oxide deposited. The process contour chart shows how these two other techniques i.e. coater height and volumetric feed, alter the coating composition on the glass substrate.

Figure 5:
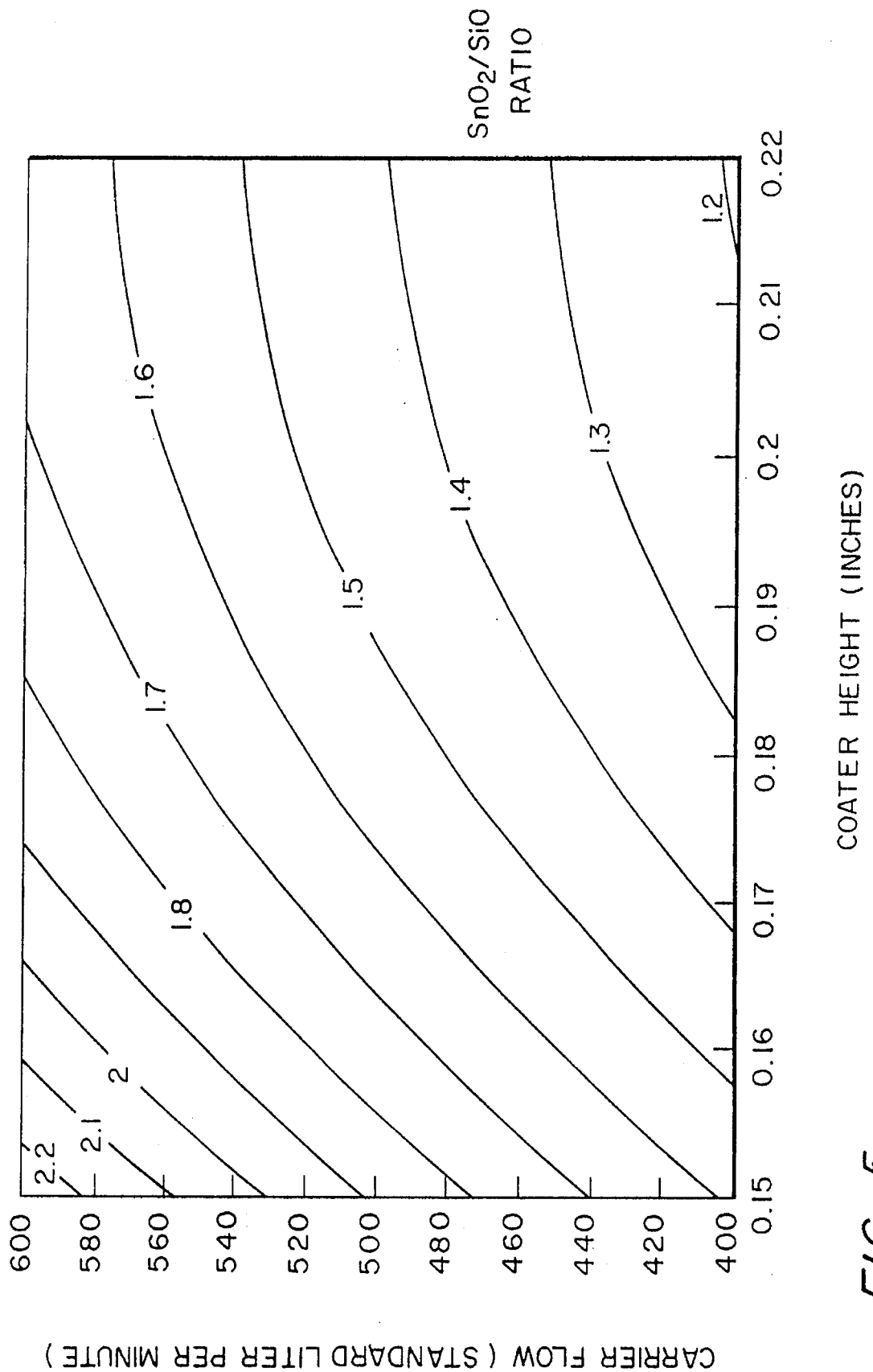
FIG. 5 is a graph showing the effect of coating apparatus height from the surface of a glass substrate and carrier flow on the ratio of tin oxide to silicon oxide in the coating deposited on the glass substrate in accordance with the teachings of the invention.

As shown in FIG. 5 increasing the carrier flow for a given coating unit height, increases the ratio of tin oxide to silicon oxide. In other words, the weight percent of tin oxide increases as the weight percent of silicon oxide decreases. Raising the coating unit height for a given carrier flow decreases the ratio of tin oxide to silicon oxide i.e. the weight percent of tin oxide decreases as the weight percent of silicon oxide increases.

EXAMPLE IV

Figure 6:
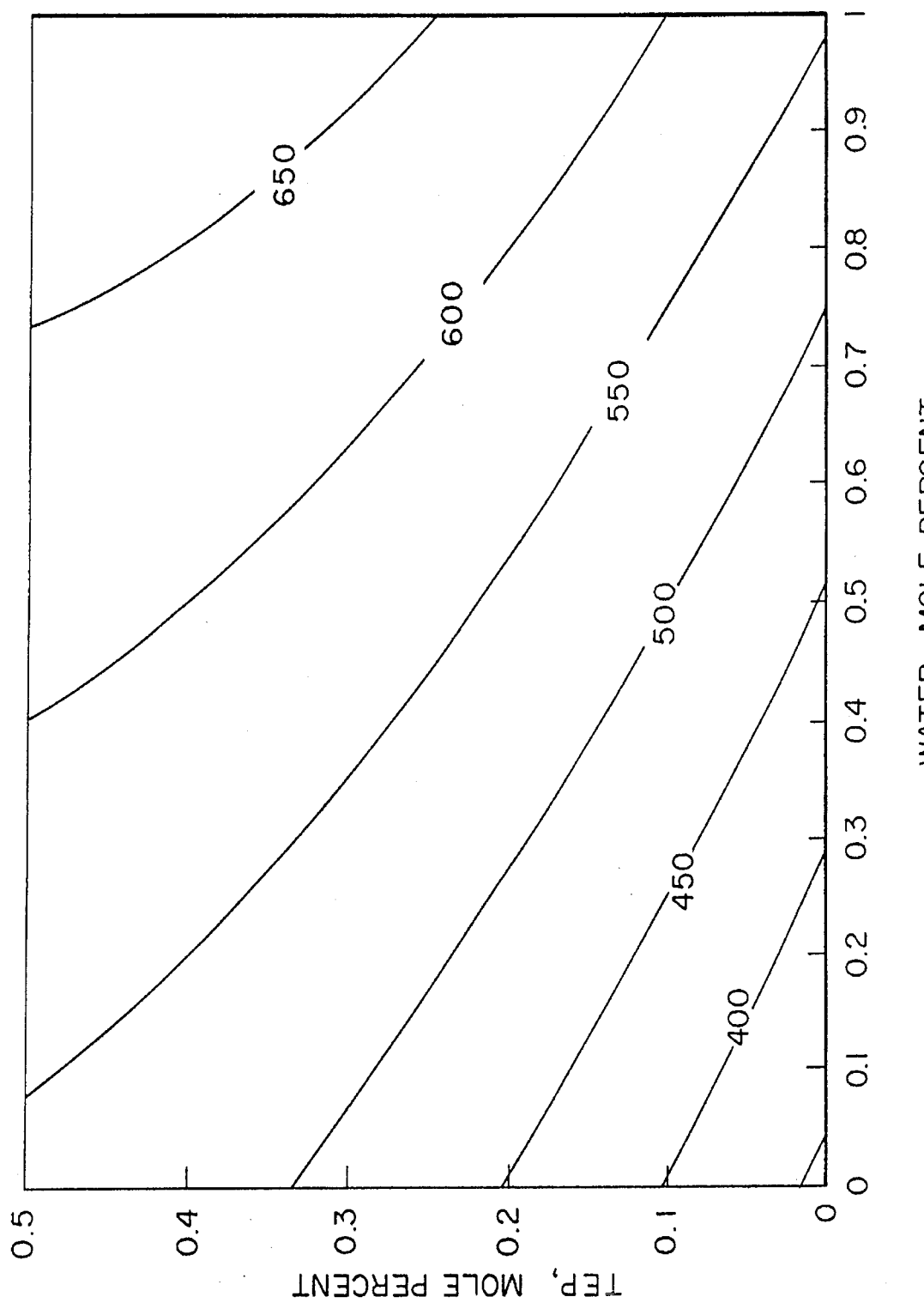
FIG. 6 is a graph showing the effect on film thickness using the accelerants of the instant invention.

A number of runs were carried out to show the effects of water and triethylphosphite on the thickness of a mixed oxide film at a constant vapor residence time. The process chart, FIG. 6, was developed using experimental design data. The coating unit 25 shown in FIG. 3 was used with the exhausts 26 and 28 positioned relative to the coating unit 25 such that x/y=1. The precursor vapor was maintained at 320°

F. (165° C.) and contained 0.8 mole percent monobutyltinchloride, 0.3 mole percent tetraethoxysilane. Triethylphosphite (TEP) and water were varied and sufficient air was added to obtain a volumetric feed rate of 500 standard liters per minute. The glass ribbon 22 had a thickness of 0.118 inch (0.300 centimeter), a temperature of 1200° F. (650° C.) and a line speed of 510 inches (13 meters) per minute. The coating unit 25 was maintained at a height of 0.22 inch (0.56 centimeter) above the surface of the glass ribbon. Note the substantial effect exhibited by the presence of triethylphosphite on the coating thickness. As the mole percent of triethylphosphite was increased the coating thickness increased. Increasing the mole percent of the water also increased the coating thickness.

EXAMPLE V

The article 12 of FIG. 1 was produced using the coating station 59 shown in FIG. 2, in conjunction with the coating station 60 described in the teachings of Henery. Coated articles were produced at three glass thicknesses i.e. at three different glass ribbon speeds to demonstrate the flexibility of the process. The coating station 59 was used to produce a coating that varied in composition from predominantly silicon oxide at the glass-coating interface 16 to predominantly pure tin oxide and the coating station 60 produced an extended thickness of predominantly tin oxide.

The coating station 59 had three coating units 61, 62 and 64 with openings 76, 80 and 84 respectively, and four exhausts 66, 68, 70 and 72. The exhausts 66 and 68 were positioned relative to the coating unit 61 in a symmetric configuration while the exhausts 68 and 70 and the exhausts 70 and 72 were arranged in an asymmetric configuration about their respective coater units 62 and 64. In addition the coating station 59 had two discharge units 31 and 32 each with opening 50. The distance between the openings 74 and 76, 76 and 78, 80 and 82, 84 and 86 was about 2-¾ inches (7.08 centimeters). The distance between the openings 80 and 78, and between 84 and 82 was about 5-½ inches (14.0 centimeters).

To effect the desired change in composition of the coating, different chemical feed rate ranges are required in each of the coating units 61, 62 and 64. The chemical concentrations required to produce the desired compositional change are also a function of the speed of the glass ribbon. Examples of typical setpoints are given in Table 3. In each of these cases the carrier gas was air, maintained at a temperature of about 320° F. (160° C.). The total gas flow of the discharge units 31 and 32 was held at about 500 standard liters per minute. The coating station 59 was spaced about 0.22 inches (0.59 centimeter) above the moving glass ribbon 22. The extended region of predominantly tin oxide was deposited at the coating station 60 using the teachings of U.S. Pat. No. 4,853,257.

The equation ($\sqrt{a^{*2}+b^{*2}}$) usually used by those skilled in the art to quantify the observability of color of an object is discussed by Hunter in *Food Technology*, Vol. *32*, pages 100–105, 1967 and in *The Measurement of Appearance*, Wiley and Sons, New York, 1975. A coated glass product having a Hunter value of 12 or less is considered to exhibit no appreciable observable color. Listed in Table 3 under the column entitled Color Saturation Index is the measured Hunter value for the samples. As can be seen, all the samples had a color saturation index below 12.

TABLE 3

| Sample # | MBTC Unit 61 mole % | MBTC Unit 62 mole % | MBTC Unit 64 mole % | TEOS Unit 61 mole % | TEOS Unit 62 mole % | TEOS Cell 64 mole % |
|---|---|---|---|---|---|---|
| 1 | 0.280 | 0.190 | 0.490 | 0.050 | 0.050 | 0.020 |
| 2 | 0.290 | 0.300 | 0.600 | 0.100 | 0.160 | 0.300 |
| 3 | 0.350 | 0.200 | 0.940 | 0.300 | 0.300 | 0.270 |
| 4 | 0.400 | 0.200 | 0.940 | 0.300 | 0.300 | 0.330 |
| 5 | 0.600 | 0.758 | 0.790 | 0.390 | 0.400 | 0.350 |
| 6 | 0.500 | 0.600 | 1.200 | 0.265 | 0.300 | 0.100 |

| Sample # | TEP Unit 61 mole % | TEP Unit 62 mole % | TEP Unit 64 mole % | WATER Unit 61 mole % | WATER Unit 62 mole % | WATER Unit 64 mole % |
|---|---|---|---|---|---|---|
| 1 | 0.300 | 0.100 | 0.025 | 0.170 | 0.600 | 0.600 |
| 2 | 0.280 | 0.110 | 0.039 | 0.180 | 0.330 | 0.630 |
| 3 | 0.280 | 0.120 | 0.070 | 0.150 | 0.610 | 0.370 |
| 4 | 0.280 | 0.100 | 0.050 | 0.150 | 0.610 | 0.370 |
| 5 | 0.266 | 0.120 | 0.066 | 0.150 | 0.180 | 0.640 |
| 6 | 0.400 | 0.300 | 0.288 | 0.400 | 1.000 | 1.000 |

| Sample # | GLASS TEMPERATURE °F. | GLASS SPEED inches/min. | COLOR SATURATION INDEX | Gradient Thickness Å | Tin Oxide Thickness Å |
|---|---|---|---|---|---|
| 1 | 1230 | 340 | 5.0 | 1200 | 4000 |
| 2 | 1234 | 340 | 5.0 | 1100 | 4000 |
| 3 | 1194 | 340 | 2.3 | 1250 | 3700 |
| 4 | 1200 | 340 | 3.6 | 1150 | 3650 |
| 5 | 1190 | 490 | 8.9 | 850 | 1750 |
| 6 | 1200 | 700 | 4.6 | 1000 | 1700 |

MBTC means monobutyltintrichloride
TEOS means tetraethoxysilane
TEP means triethyphosphite Although several embodiments of the present invention have been described and illustrated, it will be apparent to those skilled in the art that various changes and further modifications may be made therein without departure from the spirit of the invention or from the scope of the appended claims.

We claim:

1. In a coating composition vapor for the pyrolyric deposition of silicon dioxide comprising a carrier gas, a source of oxygen and a silicon compound, the improvement wherein said composition comprises at least one silicon compound comprising:

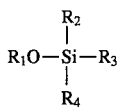

wherein $R_1$, $R_3$ and $R_4$ are to be defined and any substituent, and $R_2$ is a functional group or atom, excluding hydrogen, capable of withdrawing election density away from the silicon atom to weaken the bond between the $R_2$ functional group and the Si atom for ease of separating the $R_2$ functional group from the Si atom.

2. The coating composition vapor of claim 1 wherein $R_2$ is selected from the group consisting of halogen; alkenyl and substituted alkenyl radicals having 2 to 10 carbon atoms; halogenated alkyl and perhalogenated alkyl radicals having one to 10 carbon atoms; alkynyl and substituted alkynyl radicals having from 2 to 10 carbon atoms.

3. The coating composition of claim 2, wherein as to the $R_2$ said halogen is chlorine; said halogenated, perhalogenated or substituted alkyl radical comprises from 1 to 4 carbon atoms; and said alkynyl or substituted alkynyl radical comprises from 6 to 9 atoms.

4. The coating composition of claim 3, wherein as to the $R_2$ said halogenated, perhalogenated or substituted alkyl radical is selected from the group consisting of —$CCl_3$, —$CH_2CHClCH_3$ and —$CH_2CCl_2CCl_3$; and said alkynyl or substituted alkynyl radical is selected from the group consisting of —$C\equiv CH_3$; —$C\equiv C$—$CH_3$ and —$CH_2C\equiv CH$.

5. The coating composition of claim 2 wherein $R_1$ is selected from the group consisting of alkyl and substituted alkyl radicals having from one to 10 carbon atoms; alkenyl and substituted alkenyl radicals having from 2 to 10 carbon atoms; alkynyl and substituted alkynyl radicals having from 2 to 10 carbon atoms; aryl, aralkyl, substituted aryl and substituted aralkyl radicals having from 6 to 11 carbon atoms.

6. The composition of claim 5, wherein as to the $R_1$ said alkyl or substituted alkyl radicals have from 1 to 4 carbon atoms; said alkenyl or substituted alkenyl radicals have from 2 to 4 carbon atoms; said alkynyl or substituted alkynyl radicals have from 2 to 4 carbon atoms; and said aryl, aralkyl, substituted aryl and substituted aralkyl radicals have from 6 to 9 carbon atoms.

7. The composition of claim 6, wherein as to the $R_1$ said alkyl or substituted alkyl radicals are selected from the group consisting of —$CH_3$, —$CH_2CH_2CH_3$, —$CH_2CH_2$—OH, —$CCl_3$, —$CH_2CHClCH_3$ and —$CH_2CCl_2CCl_3$; said alkenyl or substituted alkenyl radicals are selected from the group consisting of —$CH=CHCH_3$ and —$CH=CH_2$; said alkynyl or substituted alkynyl radicals are selected from the group consisting of —$C\equiv C$—$CH_3$ and —$C\equiv CH$; and said aryl, aralkyl, substituted aryl or substituted aralkyl radicals are selected from the group consisting of —$C_6H_5$ and —$C_6H_4CH_3$.

8. The coating composition of claim 7, wherein as to the $R_2$ said halogen is chlorine; said halogenated, perhalogenated or substituted alkyl radical comprises from 1 to 4 carbon atoms; and said alkynyl or substituted alkynyl radical comprises from 6 to 9 atoms.

9. The coating composition of claim 8, wherein as to the $R_2$ said halogenated, perhalogenated or substituted alkyl radical is selected from the group consisting of —$CCl_3$, —$CH_2CHClCH_3$ and —$CH_2CCl_2CCl_3$; and said alkynyl or substituted alkynyl radical is selected from the group consisting of —$C\equiv CH_3$; —$C\equiv C$—$CH_3$ and —$CH_2C\equiv CH$.

10. The coating composition of claim 2, further comprising an accelerant selected from the group consisting of pentavalent compounds of phosphorus.

11. The coating composition of claim 10, wherein said accelerant is selected from the group consisting of $PF_5$ and $PCl_5$.

12. The composition of claim 2, further comprising an accelerant which is a compound of a metal selected from the group consisting of manganese, cobalt, iron, copper, strontium, lead, scandium, gallium, arsenic, yttrium, antimony, bismuth, tin.

13. The composition of claim 12, wherein said accelerant is selected from the group consisting of metal organic compounds, metal halide compounds and metal compounds containing a combination of organic and halogen functional groups.

14. A coating composition vapor according to claim 2, wherein $R_3$ and $R_4$ are independently selected from the group consisting of alkyl and substituted alkyl radicals having from one to 10 carbon atoms; alkenyl and substituted alkenyl radicals having from 2 to 10 carbon atoms; alkynyl and substituted alkynyl radicals having from 2 to 10 carbon atoms; aryl, aralkyl, substituted aryl and substituted aralkyl radicals having from 6 to 11 carbon atoms; hydrogen; halogen; —CN; —OCN; phosphine; alkylphosphines and dialkylphosphines wherein the alkyl radical has from 1 to 10 carbon atoms.

15. The coating composition of claim 14, wherein said compound is selected from the group consisting of trichloroethoxysilane, trichloropropoxysilane, chloroethoxysilane, dichloroethoxysilane, tri-(trichloromethyl)ethoxysilane, di-(pentachloroethyl)ethoxysilane, di-(trichloromethyl)ethoxysilane, tri-(pentachloroethyl)ethoxysilane, pentachloroethylethoxysilane, trichloromethylethoxysilane, trichloromethylpropoxysilane, trichloromethyldichloroethoxysilane, pentachloroethylchloroethoxysilane, dimethylchloromethoxysilane, trichloromethoxysilane, tetramethyldisiloxane, tetramethyldichlorodisiloxane.

16. A coating composition vapor according to claim 2, wherein said silicon compound has the formula selected from the group consisting of:

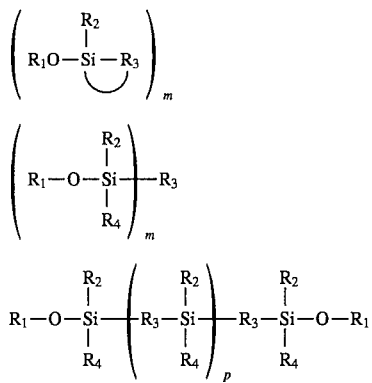

wherein m is from 2 to 7; p is from 0 to 7; $R_3$ is independently selected from the group consisting of $$-S-; \quad -\underset{|}{P}- \text{ and } -\underset{|}{N}-; \quad -O-; \text{ and } -(CH_2)_n-$$

wherein n is 1 to 10; and $R_4$ is independently selected from the group consisting of alkyl and substituted alkyl functional groups having from one to 10 carbon atoms; alkenyl and substituted alkenyl functional groups having from 2 to 10 carbon atoms; alkynyl and substituted alkynyl functional groups having from 2 to 10 carbon atoms; aryl and substituted aryl functional groups having from 6 to 11 carbon atoms; hydrogen; halogen; —CN; —OCN; phosphine and substituted phosphines.

17. The composition according to claim 2, further comprising a metal-containing compound vapor comprising a metal, M, other than silicon.

18. The composition of claim 17, wherein said compound has the formula $M(R_{22})_q$, wherein q is the valence of M and $R_{22}$ is selected from the group consisting of organic and halide radicals.

19. The composition of claim 18, wherein M is selected from the group consisting of tin, titanium, tungsten and antimony.

20. The composition according to claim 19, wherein said metal-containing compound is an organotin compound.

21. The composition according to claim 20, wherein said tin compound has the structural formula $Sn(R_{22})_4$ wherein each $R_{22}$ is independently selected from the group consisting of halogen, alkyl, aryl and acetylacetonate radicals.

22. The composition according to claim 21, wherein at least one $R_{22}$ is a halogen and at least one $R_{22}$ is an alkyl radical having from 1 to 10 carbon atoms.

23. The composition according to claim 22, wherein at least one $R_{22}$ is chloride and at least one $R_{22}$ is an alkyl radical having from 1 to 4 carbon atoms.

24. The composition according to claim 23, wherein said organotin compound is monobutyltin trichloride.

25. The composition of claim 17, further comprising an accelerant to increase the deposition rate of silicon oxide.

26. The composition of claim 25, wherein said accelerant is selected from the group consisting of water; ozone; Lewis acid; Lewis basis; trivalent compounds of nitrogen, phosphorus and boron; tetravalent compounds of sulfur and selenium; pentavalent compounds of phosphorus; and metal compounds of the formula $M(R_{22})_q$ wherein M is selected from the group consisting of manganese, cobalt, iron, nickel, copper, zinc, strontium, cadmium, lead, aluminum, scandium, chromium, gallium, arsenic, yttrium, indium, antimony, bismuth, titanium, germanium, zirconium and tin, q is the valence of M, and $R_{22}$ is selected from the group consisting of halogen, alkyl, aryl and acetylacetonate radicals.

27. The coating composition of claim 1, wherein the silicon compound has a dipole moment and further including an accelerant whereas the accelerant is a nucleophile to further weaken the bond between the Si atom and functional group $R_2$ by forming weak electrostatic bonds between the nucleophile and the Si atom to increase the deposition rate of the silicon dioxide.

28. The coating composition of claim 1, wherein the silicon compound has a dipole moment and further including an accelerant wherein the accelerant is a electophile to further weaken the bond between the Si atom and functional group $R_2$ by forming weak electrostatic bonds between the electophile and the Si atom functional group $R_2$ to increase the deposition rate of the silicon dioxide.

29. In a coating composition vapor for the pyrolyric deposition of silicon dioxide comprising a carrier gas, a source of oxygen and a silicon compound, the improvement comprising at least one silicon compound comprising:

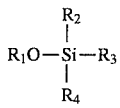

wherein $R_1$ is selected from the group consisting of alkyl and substituted alkyl radicals having from one to 10 carbon atoms; alkenyl and substituted alkenyl radicals having from 2 to 10 carbon atoms; alkynyl and substituted alkynyl radicals having from 2 to 10 carbon atoms; aryl, aralkyl, substituted aryl and substituted aralkyl radicals having from 6 to 11 carbon-atoms;

$R_2$ is selected from the group consisting of hydrogen; halogen; alkenyl and substituted alkenyl radicals having from 2 to 10 carbon atoms; halogenated alkyl and perhalogenated alkyl radicals having one to 10 carbon atoms; alkynyl and substituted alkynyl radicals having from 2 to 10 carbon atoms, $R_3$ and $R_4$ are to be defined and any substituent, and an accelerant selected from the group consisting of tetravalent compounds of sulfur and selenium, ozone, a Lewis Acid and a Lewis Base.

30. The coating composition of claim 29, wherein said accelerant is selected from the group consisting of tetravalent compounds of sulfur and selenium.

31. The coating composition according to claim 29, wherein the accelerant is ozone.

32. The composition of claim 29, wherein said accelerant is a Lewis Acid.

33. The composition of claim 32, wherein said Lewis acid is selected from the group consisting of trifluoroacetic acid, hydrochloric acid, acetic acid and formic acid.

34. The composition of claim 29, wherein said accelerant is a Lewis Base.

35. The composition of claim 34 wherein said Lewis base is selected from the group consisting of NaOH, NaF, methanol, methyl ether and ethylthioether.

36. The coating composition of claim 2, further comprising an accelerant to increase the deposition rate of silicon dioxide.

37. The coating composition of claim 36, wherein the accelerant is selected from the group consisting of trivalent compounds of nitrogen, phosphorous and boron.

* * * * *

UNITED STATES PATENT AND TRADEMARK OFFICE
CERTIFICATE OF CORRECTION

PATENT NO.   : 5,599,387
DATED        : February 4, 1997
INVENTOR(S)  : George A. Neuman, Patricia R. Athey and Royann L. Stewart-Davis It is certified that error appears in the above-indentified patent and that said Letters Patent is hereby corrected as shown below:

Claim 15, line 10, delete "tetramethyld-" and
         line 11, delete "isiloxane,".

Column 24, line 26, delete "carbon-atoms" and insert --carbon atoms--.

Signed and Sealed this

Seventeenth Day of March, 1998

Attest:

BRUCE LEHMAN

Attesting Officer        Commissioner of Patents and Trademarks